United States Patent
Iwakiri

(10) Patent No.: US 9,709,637 B2
(45) Date of Patent: Jul. 18, 2017

(54) LIGHT-EMITTING ELEMENT FAILURE DETECTOR AND METHOD FOR DETECTING LIGHT-EMITTING ELEMENT FAILURE

(75) Inventor: Toshiya Iwakiri, Tokyo (JP)

(73) Assignee: NEC Lighting, Ltd., Tokyo (JP)

( * ) Notice: Subject to any disclaimer, the term of this patent is extended or adjusted under 35 U.S.C. 154(b) by 152 days.

(21) Appl. No.: 14/130,163

(22) PCT Filed: Jun. 28, 2012

(86) PCT No.: PCT/JP2012/066610
§ 371 (c)(1),
(2), (4) Date: Dec. 30, 2013

(87) PCT Pub. No.: WO2013/005652
PCT Pub. Date: Jan. 10, 2013

(65) Prior Publication Data
US 2014/0139227 A1    May 22, 2014

(30) Foreign Application Priority Data
Jul. 4, 2011  (JP) .................. 2011-148536

(51) Int. Cl.
G01R 31/44    (2006.01)
H05B 33/08    (2006.01)

(52) U.S. Cl.
CPC ......... *G01R 31/44* (2013.01); *H05B 33/0815* (2013.01); *H01L 2251/568* (2013.01)

(58) Field of Classification Search
CPC .................................................... G01R 31/44
(Continued)

(56) References Cited

U.S. PATENT DOCUMENTS

2006/0176411 A1* 8/2006 Furukawa ......... G02F 1/133603
349/33
2008/0203946 A1* 8/2008 Ito ....................... H05B 33/083
315/307
(Continued)

FOREIGN PATENT DOCUMENTS

CN          101842914      9/2010
EP           2204856       7/2010
(Continued)

OTHER PUBLICATIONS

International Search Report corresponding to PCT/JP2012/066610, dated Sep. 18, 2012, 5 pages.

*Primary Examiner* — Son Le
*Assistant Examiner* — Akm Zakaria
(74) *Attorney, Agent, or Firm* — Wilmer Cutler Pickering Hale and Dorr LLP

(57) ABSTRACT

A light emitting element circuit includes a light emitting element (1), a current supply path to the light emitting element (1), a constant current circuit (2) that supplies a current to the light emitting element (1) via the current supply path, and an electric discharge path that discharges an electric charge accumulated at the light emitting element (1) and at a region connected between the both electrodes when the constant current circuit (2) stops a current supply to the light emitting element (1). A light emitting element failure detector (4) that detects a short-circuit of the light emitting element (1) in a light emitting element circuit includes a current instantaneous interruption circuit (5), a voltage detector (60), and a determiner (62). The current instantaneous interruption circuit (5) is arranged on the current supply path different from the electric discharge path and instantaneously interrupts an electric current that the constant current circuit (2) supplies to the light emitting element (1). The voltage detector (60) obtains an output of a voltage (Continued)

Vf between the anode and cathode of the light emitting element (1) during a period of the instantaneous interruption as a measuring object. The determiner (62) determines the existence of a short-circuit from the output.

8 Claims, 6 Drawing Sheets

(58) Field of Classification Search
USPC .......................................................... 324/414
See application file for complete search history.

(56) References Cited

U.S. PATENT DOCUMENTS

| | | | |
|---|---|---|---|
| 2010/0219764 A1* | 9/2010 | Yamasaki | H05B 33/0851 315/224 |
| 2010/0225235 A1* | 9/2010 | Nagase | H05B 33/0815 315/130 |
| 2012/0050697 A1* | 3/2012 | Suzuki | G03B 21/14 353/85 |
| 2012/0212143 A1* | 8/2012 | Esaki | H05B 33/089 315/192 |
| 2013/0106304 A1* | 5/2013 | Wee | H02M 3/33523 315/210 |

FOREIGN PATENT DOCUMENTS

| | | |
|---|---|---|
| JP | 2007-227094 | 9/2007 |
| JP | 2009-016459 | 1/2009 |
| JP | 2009-111035 | 5/2009 |
| JP | 2009-223145 | 10/2009 |
| JP | 2011-077037 | 4/2011 |
| WO | WO-2009/054224 | 4/2009 |

* cited by examiner

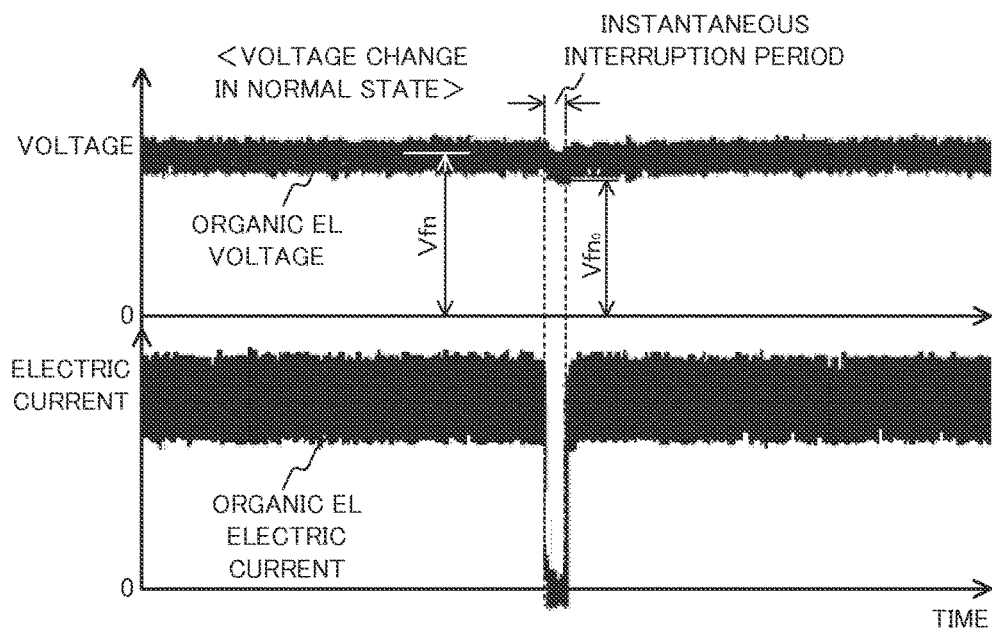
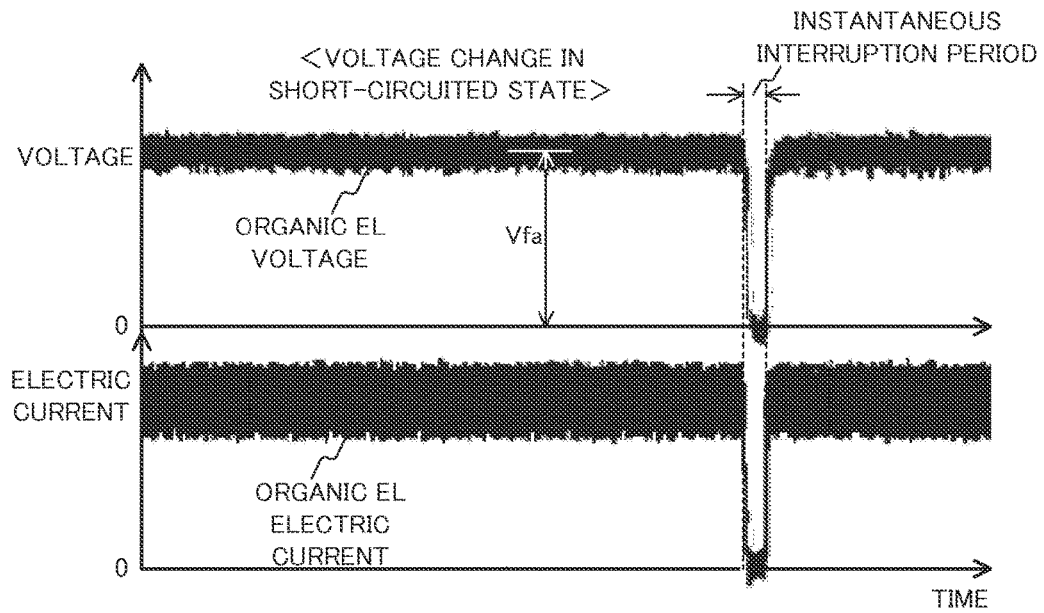

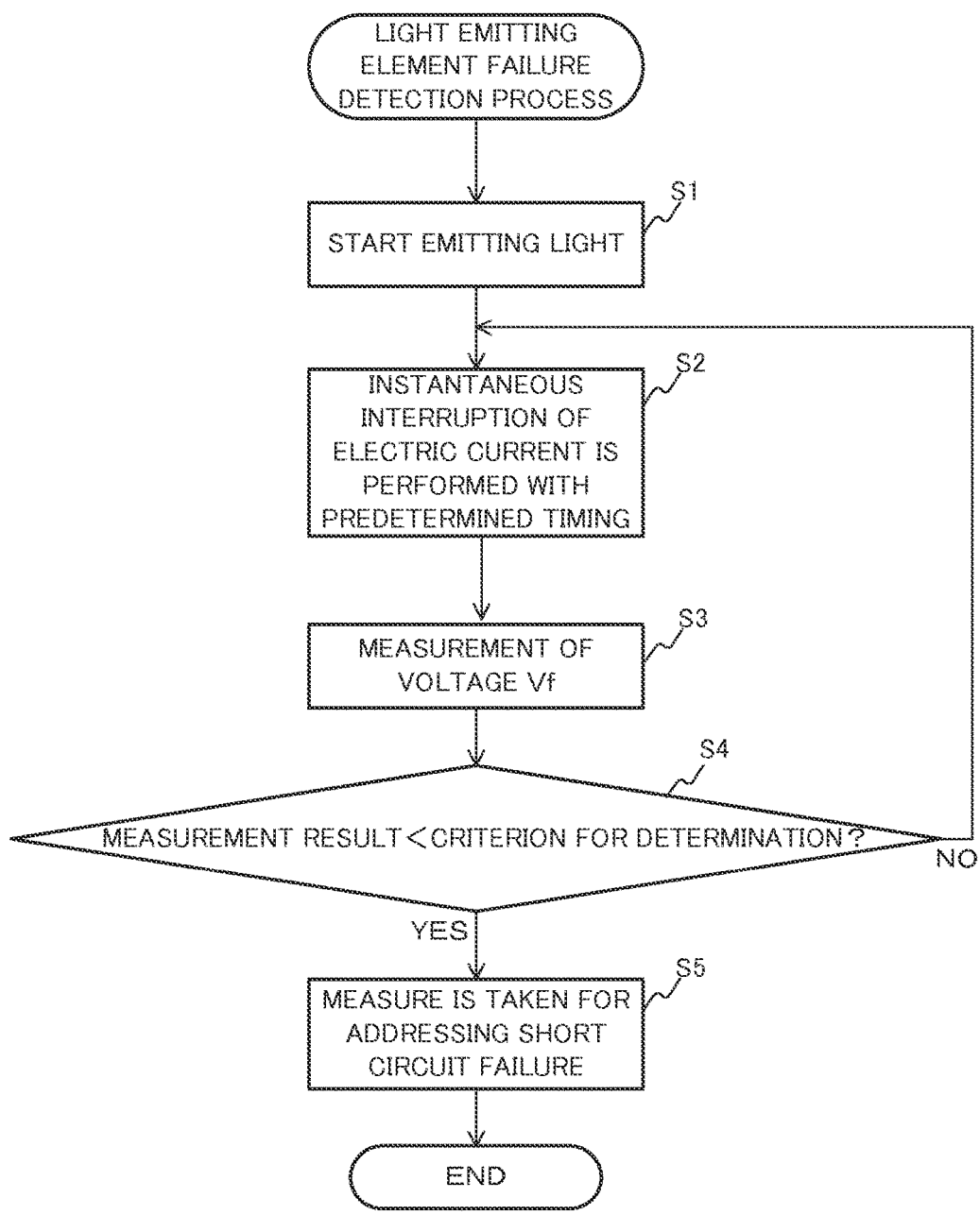

LIGHT-EMITTING ELEMENT FAILURE DETECTOR AND METHOD FOR DETECTING LIGHT-EMITTING ELEMENT FAILURE

CROSS-REFERENCE TO RELATED APPLICATIONS

This application is a national stage application of International Application No. PCT/JP2012/066610 entitled "Light-Emitting Element Breakdown Detector and Method for Detecting Light-Emitting Element Breakdown," filed on Jun. 28, 2012, which claims the benefit of the priority of Japanese Patent Application No. 2011-148536, filed on Jul. 4, 2011, the disclosures of each of which are hereby incorporated by reference in their entirety.

TECHNICAL FIELD

The present invention relates to a light emitting element failure detector for detecting a failure of a light emitting element and a light emitting element failure detection method.

BACKGROUND ART

Use of an organic electro-luminescence element (hereinafter, referred to as "organic EL element") as a light source of a lighting device is proposed.

When an organic EL element is short-circuited, a voltage Vf corresponding to an impedance between the anode and cathode of an organic EL element is applied between anode and cathode. The voltage Vf is lower than the voltage between the anode and cathode of an organic EL in a normal state.

Failure detection means described in Patent Literature 1 measures an electric potential Vf of an anode electrode of an organic EL element. When the electric potential Vf of the anode electrode is lower than a reference voltage, the failure detection means of Patent Literature 1 detects a short circuit failure of the organic EL element.

When the organic EL element is short-circuited, an electric current flowing into the organic EL element increases since the impedance between the anode and cathode of the organic EL element decreases.

Failure detection means described in Patent Literature 2 measures the voltage of a resistance connected to an organic EL element in series. Increase in current can be detected by the measured voltage. The failure detection means described in Patent Literature 2 therefore detects a short circuit failure when the measured voltage exceeds a predetermined threshold.

A short circuit failure of the light emitting element can be detected by the measurement of the voltage Vf (output voltage) between the anode and cathode of the light emitting element.

A circuit protector (failure detection means) described in Patent Literature 3 comprises a first comparator and a second comparator. The first comparator outputs a high level voltage when the output voltage of an LED (LIGHT EMITTING DIODE) is larger than a first reference voltage. The first comparator outputs a low level voltage when the output voltage of an LED is smaller than the first reference voltage. The second comparator compares the output voltage of the first comparator with a second reference voltage. The second comparator outputs a low level or a high level voltage depending on the comparison result. The circuit protector detects a short circuit failure from the output voltages of the first comparator and the second comparator.

The above-mentioned failure detection means measures the voltage Vf between the anode and cathode of a light emitting element, or a voltage associated with the Vf. The failure detection means then detects a short circuit failure of a light emitting element from the measured voltage and the reference voltage.

CITATION LIST

Patent Literature

Patent Literature 1: Unexamined Japanese Patent Application Kokai Publication No. 2009-223145.
Patent Literature 2: Unexamined Japanese Patent Application Kokai Publication No. 2007-227094.
Patent Literature 3: Unexamined Japanese Patent Application Kokai Publication No. 2011-077037.

SUMMARY OF INVENTION

Technical Problem

The voltage Vf between anode and cathode of a light emitting element varies depending on the V-I characteristics, change with time, environmental temperature of the element, or the like. The voltage Vf of the light emitting element changes also depending on the impedance between the anode and cathode of a short-circuited light emitting element.

The present invention has been made in view of the above-mentioned circumstances, and an object of the invention is to provide a light emitting element failure detector and a light emitting element failure detection method, which can detect a short circuit failure without affected by the variation, change, fluctuation or the like of the voltage Vf of a light emitting element.

Solution to Problem

In order to achieve the above objective, a light emitting element failure detector according to a first aspect of the invention is a light emitting element failure detector that detects a short-circuit of a light emitting element in a light emitting element circuit that includes the light emitting element, a current supply path to the light emitting element, a constant current circuit that supplies a current to the light emitting element via the current supply path, and an electric discharge path that discharges an electric charge accumulated at the light emitting element and at a region connected between both electrodes of the light emitting element when the constant current circuit stops a current supply to the light emitting element, the light emitting element failure detector comprising:

a current instantaneous interruption circuit that is arranged on the current supply path different from the electric discharge path and that instantaneously interrupts an electric current that the constant current circuit supplies to the light emitting element, a voltage detector that obtains an output of a voltage Vf between the anode and cathode of the light emitting element during a period of the instantaneous interruption as a measuring object, and a determiner that determines the existence of the short-circuit from the output.

A light emitting element failure detection method according to a second aspect of the invention is a light emitting element failure detection method that detects a short-circuit of a light emitting element in a light emitting element circuit that includes the light emitting element, a current supply path to the light emitting element, a constant current circuit that supplies a current to the light emitting element via the current supply path, and an electric discharge path that discharges an electric charge accumulated at the light emitting element and at a region connected between both electrodes of the light emitting element when the constant current circuit stops a current supply to the light emitting element, the light emitting element failure detection method comprising:

a current instantaneous interruption step in which, on the current supply path different from the electric discharge path, an electric current that the constant current circuit supplies to the light emitting element is instantaneously interrupted, a voltage detection step in which an output is obtained by using a voltage Vf between the anode and cathode of the light emitting element during a period of the instantaneous interruption is obtained as a measuring object, and a determination step in which the existence of a short-circuit is determined from the output.

Advantageous Effects of Invention

According to the present invention, a light emitting element failure detector and a light emitting element failure detection method, which can detect a short circuit failure without affected by the variation, change, fluctuation or the like of the voltage Vf of a light emitting element, can be provided.

BRIEF DESCRIPTION OF DRAWINGS

FIG. 2A is a diagram illustrating operating conditions of the light emitting element failure detector in cases where the light emitting element failure detector of the Embodiment 1 comprises a light emitting element in a normal state;

FIG. 2B is a diagram illustrating operating conditions of the light emitting element failure detector in cases where the light emitting element failure detector of the Embodiment 1 comprises a light emitting element which is short-circuited;

FIG. 4 is a flowchart illustrating a light emitting element failure detection process of Embodiment 1;

DESCRIPTION OF EMBODIMENTS

Embodiment 1

Figure 1:
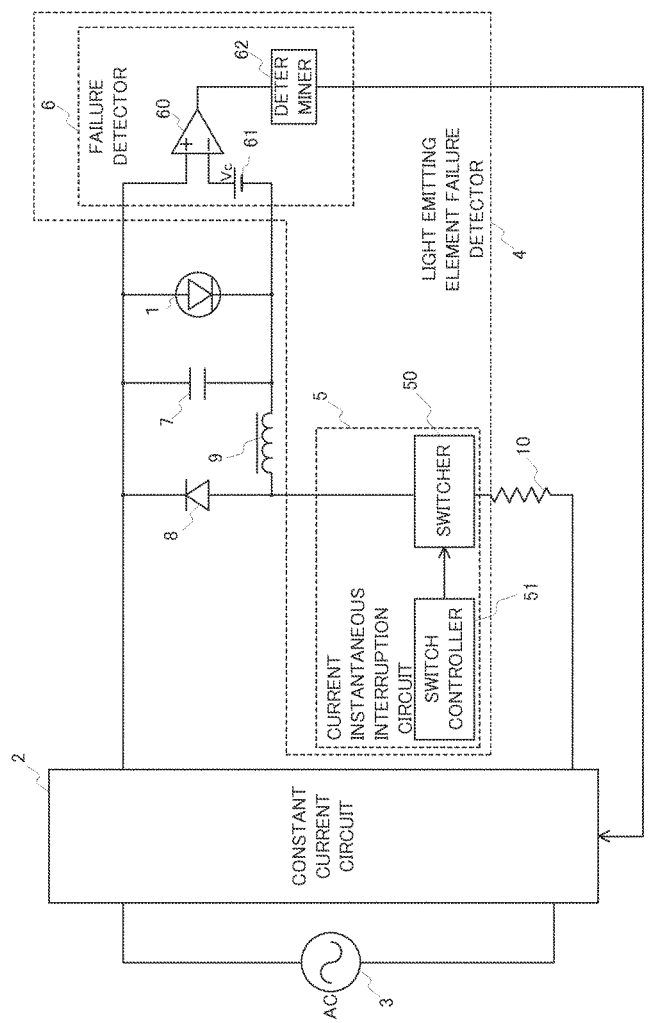
FIG. 1 is a block diagram illustrating the constitution of a light emitting element circuit comprising a light emitting element failure detector according to Embodiment 1 of the present invention.

FIG. 1 illustrates the constitution of a light emitting element circuit comprising a light emitting element failure detector according to Embodiment 1 of the present invention. The light emitting element circuit comprises a light emitting element 1, a constant current circuit 2 which supplies a predetermined electric current to the light emitting element 1, an AC power supply 3 which supplies electric power to the constant current circuit 2, and a light emitting element failure detector 4 which detects a short-circuit of the light emitting element 1. The light emitting element failure detector 4 comprises a current instantaneous interruption circuit 5 and a failure detector 6.

In the light emitting element circuit, a capacitance is considered to be connected to the light emitting element 1 in parallel. A capacitor 7 represents the capacitance (FIG. 1). A diode 8 is connected to the capacitor 7 and the light emitting element 1 in parallel. Further, a coil 9 is connected to at least one of electric paths connecting the capacitor 7 and the light emitting element 1 to the diode 8. The diode 8 is arranged in a polarity opposite to the polarity of the light emitting element 1 which is connected in parallel thereto. The capacitor 7, the light emitting element 1, the coil 9 and the diode 8 together forms an electric discharge path. The electric discharge path discharges an electric charge which the light emitting element 1 and the capacitor 7 have accumulated when a current supply to the light emitting element 1 is stopped. The coil 9 may be a resistance.

A resistance 10 is connected to the light emitting element 1 in series. The constant current circuit 2 supplies an electric current to the light emitting element 1 via the resistance 10.

The current instantaneous interruption circuit 5 comprises a switcher 50 and a switch controller 51. The switcher 50 instantaneously interrupts an electric current by switching between supplying and stopping an electric current. The switch controller 51 controls the instantaneous interruption of an electric current by controlling switching of the switcher 50.

The switcher 50 is constituted of, for example, an FET (Field Effect Transistor). The switcher 50 is arranged at a position which is on a current supply path from the constant current circuit 2 to the light emitting element 1 and which is different from the electric discharge path.

The switch controller 51 outputs an ON/OFF switching signal to the switcher 50 with predetermined timing. In cases where the switcher 50 is an FET, the switch controller 51 outputs a switching signal to a gate electrode of the FET.

The failure detector 6 comprises a voltage detector 60, a DC power supply 61, and a determiner 62. The voltage detector 60 comprises two input terminals, and outputs a signal proportional to a voltage applied between both the terminals. The DC power supply 61 is connected to one of two input terminals of the voltage detector 60, and outputs a reference voltage Vc which is a direct-current voltage to one of the input terminals. The determiner 62 receives the output of the voltage detector 60, and determines the existence of a short circuit failure based on the output.

The voltage detector 60 is constituted of, for example, a differential amplifier. The voltage detector 60 outputs a detection result when the detection target is a voltage Vf between the anode and cathode of the light emitting element 1, and a voltage obtained by subtracting a reference voltage Vc which is a fixed value from the voltage Vf is set to an input. In FIG. 1, the DC power supply 61 is connected to one of the two input terminals of the voltage detector 60 in series. One of the input terminals is connected to a cathode of the light emitting element 1 via the DC power supply 61. The other one of two input terminals is connected to an anode of the light emitting element 1. With regard to the polarity of the reference voltage Vc, in the example illustrated in FIG. 1, the input terminal side is a positive electrode, and the cathode side is a negative electrode. By this, a voltage Vf−Vc is applied between the two input terminals of the voltage detector 60.

To the determiner 62, an output from the voltage detector 60 is input. The determiner 62 determines the existence of a short circuit failure from the output. The determiner 62 outputs a control signal to the constant current circuit 2 when the determiner 62 determines that a short circuit failure occurs. To the constant current circuit 2, the control signal is input, thereby stopping a current supply to the light emitting element 1.

FIG. 2A and FIG. 2B illustrate operating conditions of the light emitting element failure detector 4 of Embodiment 1. In particular, FIG. 2A illustrates the change of a voltage Vf between the anode and cathode of the light emitting element 1 in a normal state over time. FIG. 2B illustrates the changes of an electric current which flows to the light emitting element 1 and a voltage Vf between the anode and cathode of the light emitting element 1 over time in cases where an electric current is instantaneously interrupted with respect to the short-circuited light emitting element 1.

Assume that the voltage Vf between the anode and cathode of the light emitting element 1 in a normal state is Vfn. When an electric current is instantaneously interrupted, the voltage Vf slightly decreases from Vfn to $Vfn_0$ as illustrated in FIG. 2A. In other words, the voltage Vf does not rapidly decreases to 0 V. This is because the time constant in which an electric charge which the capacitor 7 and light emitting element 1 accumulate is discharged via an electric discharge path is large. The term "normal state" refers to a state in which a short-circuit does not occur.

On the other hand, when the light emitting element 1 is short-circuited, the light emitting element 1 can be replaced with a resistance having a small resistance value as an equivalent circuit. The voltage Vf of the light emitting element 1 thus decreases to a Vfa which is smaller than Vfn. With respect to the short-circuited light emitting element 1, as illustrated in FIG. 2B, due to a small discharge time constant, the voltage Vf of the light emitting element 1 rapidly decreases to 0 V by an instantaneous interruption of an electric current.

The instantaneous interruption period is set to a time which is longer than a time for which the voltage Vf decreases to 0 V with respect to the short-circuited light emitting element 1, and in which stopping of the light emitting of the light emitting element 1 by an instantaneous interruption is not recognized by an observer. The instantaneous interruption period is determined in advance by calculation or a trial. It is noted that the voltage Vf of the light emitting element 1 in a normal state does not decrease to 0 V by an instantaneous interruption in which stopping of the light emitting of the light emitting element 1 is not recognized by an observer.

Accordingly, a threshold for detecting a short circuit failure is set to a value smaller than $Vfn_0$ and larger than 0 V. When the voltage Vf decreases to not higher than the threshold by an instantaneous interruption of an electric current, a light emitting element failure detector 4 detects a short-circuit. In other words, the determiner 62 determines that a short circuit failure occurs.

Figure 3A:
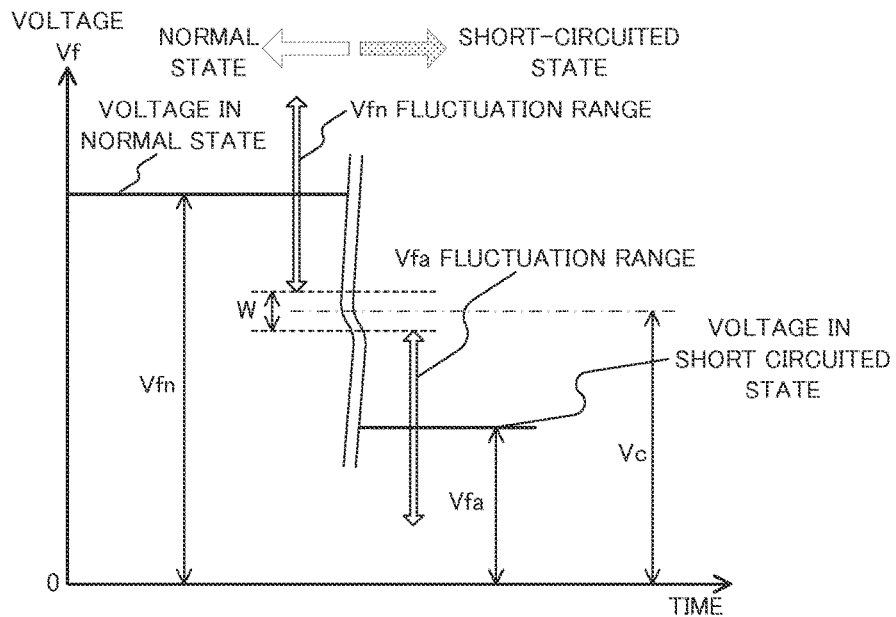
FIG. 3A is a diagram illustrating the setting of a threshold of a conventional light emitting element failure detector.
Figure 3B:
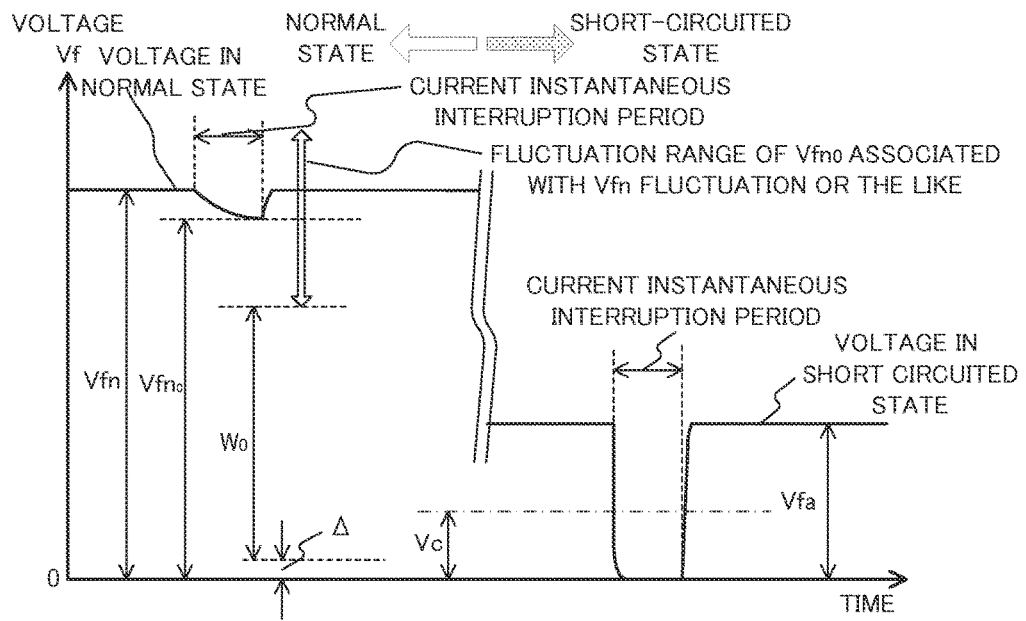
FIG. 3B is a diagram explaining the setting of a threshold of a light emitting element failure detector of Embodiment 1.

The setting of the threshold will be explained by comparing to a conventional example (FIG. 3A, FIG. 3B). As illustrated in FIG. 3A, in a conventional example, the threshold is set to a value between Vfn and Vfa. A conventional light emitting element failure detector has detected a short-circuit by whether or not Vf is a threshold or lower.

The Vfn largely fluctuates depending on variation in the V-I characteristics, temperature change, change with time of the light emitting element 1, or the like. Since the Vfa depends on the resistance component of the short-circuited light emitting element 1, the Vfa largely fluctuates depending on the state of the short-circuit. Therefore, after predicting fluctuations of Vfn and Vfa, the threshold is set in a range W which does not belong to both fluctuation ranges. Since the range W is narrow, the setting of the threshold is difficult.

On the other hand, in the present embodiment, in cases where an electric current is instantaneously interrupted, the voltage Vf of the light emitting element 1 in a normal state slightly decreases to $Vfn_0$. In the present embodiment, in cases where an electric current is instantaneously interrupted, the voltage Vf of the short-circuited light emitting element 1 rapidly decreases to 0 V. Since, as illustrated in FIG. 3B, $Vfn_0$ fluctuates depending on variation in the V-I characteristics, temperature change, change with time of the light emitting element 1, or the like, the threshold is set to a value lower than the lower limit of the fluctuation of $Vfn_0$ and higher than 0 V (FIG. 3B). The range $W_0$ is considerably wider than a range W of a conventional example. Practically, the term "a value higher than 0 V" refers to a value which is higher than a value obtained by adding a tolerance $\Delta$ to 0 V. The tolerance $\Delta$ may be a positive value. For example, the tolerance $\Delta$ is set to ½ of a fluctuation width which the voltage Vf has near 0 V.

By the above-mentioned setting of the threshold, the light emitting element failure detector 4 can detects as a short circuit failure a case in which the voltage Vf between the anode and cathode of the light emitting element 1 is lower than the threshold when an electric current is blocked.

Operating conditions of the light emitting element failure detector 4 illustrated in FIG. 1 will be concretely explained. The light emitting element 1 emits light by an electric current which the constant current circuit 2 supplies, and is utilized for a lighting device, a display device, or the like.

The current instantaneous interruption circuit 5 instantaneously interrupts an electric current which is supplied to the light emitting element 1 at a current supply path which is not an electric discharge path. The instantaneous interruption period is set in a manner as mentioned above.

In FIG. 1, a reference voltage Vc is set to a threshold. A voltage detector 60 measures a voltage obtained by subtracting the reference voltage Vc from a voltage Vf between both electrodes of the light emitting element 1 as an input. The occurrence of a short circuit failure is determined by whether the voltage Vf is lower than the reference voltage Vc or not when an electric current is instantaneously interrupted. In the case of FIG. 1, the determiner 62 determines the occurrence of a short circuit failure by the sign of an input voltage between two input terminals of the voltage detector 60, in other words the sign of an output of the voltage detector 60 when an electric current is instantaneously interrupted. For the determination of the sign, 0 is set as a criterion. The determiner 62 determines the magnitude relationship between the output of the voltage detector 60 and the criterion for determination. In cases where the signs of the input and output of the voltage detector 60 are designed to be the same (hereinafter, this case is premised; when the signs of the input and output are reversed, the determination is performed by reversing positive and negative), a short circuit failure is determined to occur when the output of the voltage detector 60 is negative. In this case, the determination by the criterion for determination 0 is equivalent to determination of whether the voltage Vf is smaller than the reference voltage Vc as a threshold or not.

When the determiner 62 determines that a short circuit failure occurs, the determiner 62 outputs, for example, to the constant current circuit 2, a control signal which stops a current supply to the light emitting element 1.

FIG. 4 illustrates a flowchart of a light emitting element failure detection process.

The AC power supply 3 is allowed to be in an ON state. By this, the constant current circuit 2 supplies an electric current to the light emitting element 1. The light emitting element 1 to which an electric current is supplied starts emitting light (step S1).

Next, the current instantaneous interruption circuit 5 instantaneously interrupts a current supply to the light emitting element 1 with predetermined timing (step S2). The voltage detector 60 measures the voltage Vf between the anode and cathode of the light emitting element 1 (step S3). In the example of FIG. 1, the voltage detector 60 obtains a voltage by subtracting the reference voltage Vc from the reference voltage Vf as an input, and the voltage detector 60 obtains the measurement result thereof as an output. Next, the determiner 62 determines whether the output of the voltage detector 60 is lower than the criterion for determination 0 or not (step S4). When the output of the voltage detector 60 is lower than the criterion for determination 0, in other words, when the sign of the output is negative (step S4; YES), the determiner determines that a short circuit failure occurs. By the determination, a measure is taken for addressing the short-circuit such as stopping a current supply to the light emitting element 1 by turning the constant current circuit 2 OFF (step S5). By this, a light emitting element failure detection process ends. When the output of the voltage detector 60 is the criterion for determination 0 or higher, in other words, when the sign of the output is positive or the output is 0 (step S4; NO), the determiner 62 determines that the light emitting element 1 is normal. By the determination, the process returns to the step S2, and each component repeats the light emitting element failure detection process. As a measure for addressing the short-circuit, for example, other than turning the constant current circuit 2 OFF to stop a current supply to the light emitting element 1, stopping the current supply and displaying the notice of the occurrence of a short circuit failure or warning, or the like is considered.

A range $W_0$ in which the threshold (reference voltage Vc) illustrated in FIG. 3B can be set is wider than the range W in which a conventional threshold can be set. For the lower limit of the range $W_0$, fluctuation thereof needs not be considered, and the lower limit may be higher than 0 V. Accordingly, by setting the threshold near 0 V with a tolerance of $\Delta$ or larger, a threshold (here, the reference voltage Vc) which is a reference for detecting a short circuit failure can be set substantially without considering the fluctuation range of the $Vfn_0$, in other words, without considering variation in the V-I characteristics, change with time, environmental temperature, or the like for each element, or without considering the degree of a short circuit failure.

A DC power supply 61 may be connected not to an input terminal illustrated in FIG. 1 of the voltage detector 60 but to the other input terminal. It is noted that, in this case, the DC power supply 61 applies a voltage having a polarity opposite to the polarity in the case of FIG. 1 such that the electric potential on the anode side of the voltage detector 60 is lower by the reference voltage Vc. By this, the output of the voltage detector 60 is the same as in the case of the constitution illustrated in FIG. 1.

The determiner 62 may be included in the voltage detector 60. For example, the voltage detector 60 outputs a predetermined output only when the input voltage between the two input terminals is a negative value.

The determiner 62 needs not be necessarily included in a failure detector 6. For example, the determiner 62 may be designed such that, when a negative output from the voltage detector 60 is input to the constant current circuit 2, the constant current circuit 2 is OFF. In such a design, the determiner 62 is substantially embedded in the constant current circuit 2. In this case, the step S4 in the flowchart illustrated in FIG. 4 is substantially carried out in the constant current circuit 2.

An example of a switcher 50 constituted of an FET has been described, but not limited thereto as long as it is the one in which a quick ON/OFF switching of an electric current can be performed, and may be constituted of a semiconductor switch such as an IGBT (Insulated Gate Bipolar Transistor).

Figure 5:
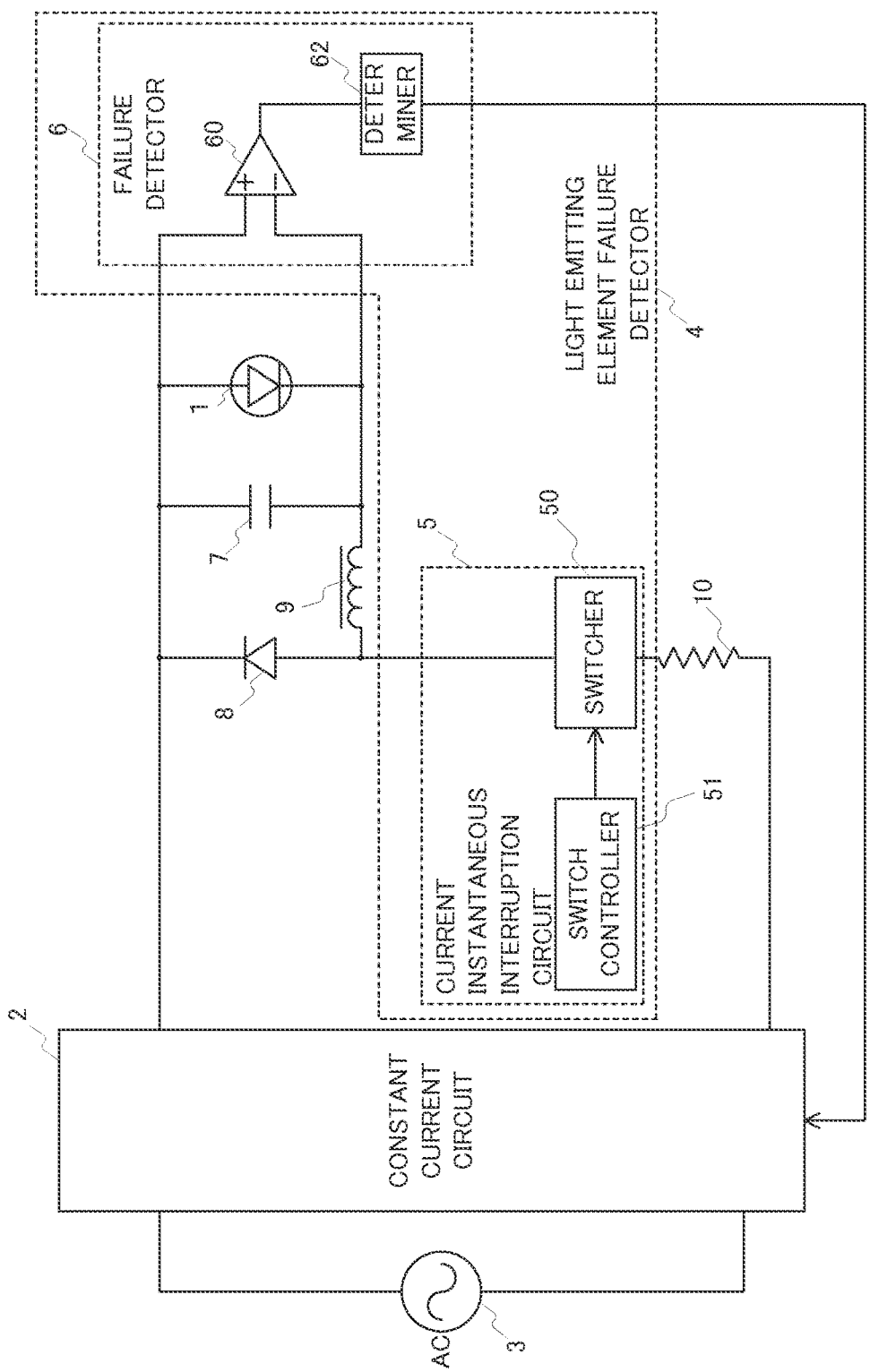
FIG. 5 is a block diagram illustrating the constitution of a light emitting element circuit comprising a modified example of the light emitting element failure detector of Embodiment 1.

FIG. 5 illustrates a modified example of a light emitting element failure detector 4 according to Embodiment 1. The light emitting element failure detector 4 differs from the light emitting element failure detector 4 illustrated in FIG. 1 in the constitution of the failure detector 6. In the modified example, the DC power supply 61 is not used, and the two input terminals of the voltage detector 60 are directly connected to the anode and cathode of the light emitting element 1 respectively. The determiner 62 does not determine the sign of the output of the voltage detector 60 but determines whether the output of the voltage detector 60 is lower than a criterion for determination $\epsilon$ different from 0 or not. Specifically, when the determiner 62 determines that the output of the voltage detector 60 is lower than the criterion for determination $\epsilon$, the determiner determines that the short circuit failure occurs, and carries out a predetermined process at the occurrence of a short circuit failure. When the determiner 62 determines that the output of the voltage detector 60 is the criterion for determination $\epsilon$ or higher, the determiner determines that a short circuit failure does not occur, which is normal. The criterion for determination $\epsilon$, compared with the Embodiment 1, is a value corresponding to an output when a reference voltage Vc is input to between the two input terminals of the voltage detector 60. The determination by the determiner 62 is thus equivalent to the determination of whether the voltage Vf is smaller than a reference voltage Vc which is a threshold. Also in the modified example, the voltage detector 60 or constant current circuit 2 may be constituted to include the determiner 62.

When a plurality of the light emitting elements 1 are connected in series and used, a current instantaneous interruption circuit 5 may be arranged in the light emitting element circuit. In this case, a failure detector 6 may be arranged between the anode and cathode of each of the light emitting element 1. By this, when a short circuit failure occurs in any of the light emitting elements 1, the short circuit failure can be detected. Based on the detection result, for example, by turning the constant current circuit 2 OFF, an electric current to the whole plurality of the light emitting elements 1 can be stopped. By taking such a measure, an induction of a failure can be prevented since an excessive voltage is not applied to other normal light emitting elements 1. A measure in cases where a short circuit failure is detected is not limited thereto, and various measures can be taken according to a predetermined procedure.

By a light emitting element failure detector 4 and a light emitting element failure detection method according to Embodiment 1, a threshold (or a reference voltage Vc) which is a reference for detecting a short circuit failure can be set without affected by the variation, change, fluctuation or the like of the voltage Vf between the anode and cathode of the light emitting element 1. Accordingly, by the present Embodiment, the light emitting element failure detector 4 and a light emitting element failure detection method, which can detect a short circuit failure without affected by the variation, change, fluctuation or the like of the voltage Vf between the anode and cathode of the light emitting element 1, can be provided.

Embodiment 2

Figure 6:
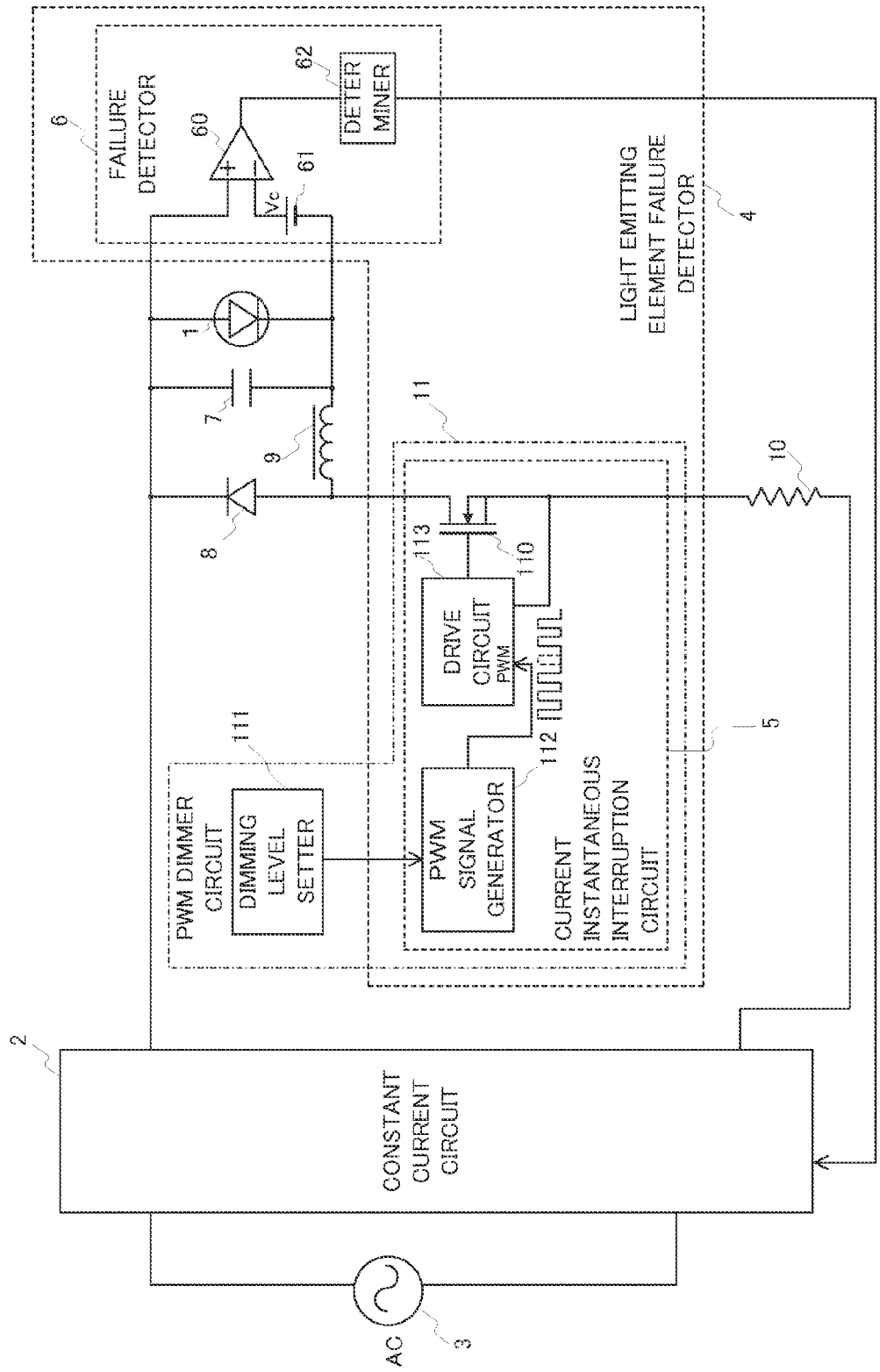
FIG. 6 is a block diagram illustrating the constitution of a light emitting element circuit comprising a light emitting element failure detector of Embodiment 2.

FIG. 6 illustrates an example of the constitution of a light emitting element circuit comprising a light emitting element failure detector 4 of Embodiment 2. In the present Embodiment, the light emitting element circuit uses a PWM (Pulse Width Modulation) control for dimming control of the light emitting element 1.

In the PWM control, a pulse train having a predetermined frequency is supplied to the light emitting element 1. Dimming of the light emitting element 1 is controlled by the pulse width of the supplied pulse.

The light emitting element circuit of the present Embodiment comprises a PWM dimmer circuit 11. The PWM dimmer circuit 11 comprises a current-controlling switch 110, a dimming level setter 111, a PWM signal generator 112, and a drive circuit 113. The current-controlling switch 110 is arranged on a current supply path to the light emitting element 1 different from the electric discharge path. The current-controlling switch 110 carries out an ON/OFF control of a current supply to the light emitting element 1. The current-controlling switch 110 is constituted of, for example, an FET (FIG. 5). The dimming level setter 111 sets a dimming level of the light emitting element 1. The PWM signal generator 112 selects a pulse width from the set dimming levels. The PWM signal generator 112 generates a pulse train (PWM signal) having a predetermined frequency having the selected pulse width. The drive circuit 113 controls ON/OFF of current supply by the current-controlling switch 110 according to the PWM signal. Other constitutions are similar to Embodiment 1.

In Embodiment 2, the current instantaneous interruption circuit 5 in Embodiment 1 is constituted of a part of the PWM dimmer circuit 11. Specifically, the current-controlling switch 110 serves as the switcher 50 in Embodiment 1. The PWM signal generator 112 and drive circuit 113 serve as the switch controller 51 in Embodiment 1.

Embodiment 2 is characterized in that the PWM signal generator 112 generates a pulse train such that a part of the pulse train is removed in succession at a predetermined cycle. For example, one pulse or a plurality of pulses per N pulses are removed in succession from the pulse train. The period of absence of a pulse created by the removal corresponds to the instantaneous interruption period of an electric current in Embodiment 1.

In Embodiment 2, since an electric current is supplied to the light emitting element 1 in a pulse train, an instantaneous interruption of an electric current constantly occurs. Accordingly, a voltage drop constantly occurs in accordance with the pulse train. However, when the pulse train is continuous, the instantaneous interruption period is very short, and therefore, the voltage Vf does not rapidly decrease to 0 V. In a state where the light emitting element 1 is short-circuited, the PWM signal generator 112 selects the number of pulses to be serially removed, based on the time for which the voltage Vf decreases to 0 V and the pulse width. The setting of the instantaneous interruption period is similar to Embodiment 1. The pulse width is selected by the PWM signal generator 112 depending on the pulse width.

The operating conditions of the present Embodiment are similar to that of Embodiment 1 except for the method of instantaneous interruption. The Embodiment 1 of FIG. 4 is also valid in Embodiment 2 by changing the process "instantaneous interruption of a current supply is performed with predetermined timing" in the step S2 of the flowchart of FIG. 4 to "instantaneous interruption of a current supply is performed by removing a pulse from the pulse train with predetermined timing" in Embodiment 2.

In Embodiment 2, the PWM signal generator 112 generates a pulse train in which a pulse is removed at a predetermined cycle. By supplying the pulse train from which a pulse has been removed to the light emitting element 1, the PWM signal generator 112 and drive circuit 113 have the function of the switch controller 51 in Embodiment 1. The current-controlling switch 110 has the function of the switcher 50 in Embodiment 1. According to Embodiment 2, the current instantaneous interruption circuit 5 can be attained without adding a new hardware. The light emitting element failure detector 4 in the present Embodiment has a similar advantageous effect to the effect described in Embodiment 1.

The constitution of the failure detector 6 illustrated in FIG. 6 may be replaced with the constitution of the failure detector 6 illustrated in FIG. 5.

The present invention is not limited to the above-mentioned Embodiment, and various modifications and applications thereof are available.

Specifically, the constitutions of the circuits in the drawings are only for an illustrative purpose, and may be arbitrarily changed as long as a similar function is obtained.

The light emitting element failure detector 4 can also be constituted of CPU (Central Processing Unit), a memory, or the like. In this case, the CPU can execute a program stored in the memory and execute the above-mentioned light emitting element failure detection process.

Further, the light emitting element 1 may be, other than the organic EL element, an LED (LIGHT EMITTING DIODE) element.

Further, although, in the above, an electric current is instantaneously interrupted by utilizing a switch controller 51 which outputs an ON/OFF switching signal with predetermined timing or the PWM dimming function of the PWM dimmer circuit 11, an electric current which flows in the light emitting element 1 may also be instantaneously interrupted by other constitutions. In order for an electric current not to flow in the light emitting element 1, bypass means may be arranged on a current supply path of the light emitting element circuit for bypassing.

Still further, although, in the above, the constitution in which the voltage Vf between the anode and cathode of the light emitting element 1 is detected by the voltage detector 60 constituted of a differential amplifier connected to the light emitting element 1 in parallel is used, other detection methods may also be used.

Although, in the above, the determiner 62 outputs a control signal which stops a current supply to the light emitting element 1 with respect to the constant current circuit 2, such a signal may be output to the switcher 50 of the current instantaneous interruption circuit 5 and turn the switcher 50 OFF to stop a current supply to the light emitting element 1. In this case, in order to maintain the OFF state of the switcher 50, the determiner 62 may have a constitution in which e.g. a flip-flop is arranged in an output step of the determiner 62 and the above-mentioned control signal is continued to be output.

A part or the whole of the above-mentioned Embodiments can be as described in the following appendices, but not limited thereto.

Appendix 1

A light emitting element failure detector that detects a short-circuit of a light emitting element in a light emitting element circuit that includes the light emitting element, a current supply path to the light emitting element, a constant current circuit that supplies a current to the light emitting element via the current supply path, and an electric discharge path that discharges an electric charge accumulated at the light emitting element and at a region connected between both electrodes of the light emitting element when the constant current circuit stops a current supply to the light emitting element, the light emitting element failure detector comprising:

a current instantaneous interruption circuit that is arranged on the current supply path different from the electric discharge path and that instantaneously interrupts an electric current that the constant current circuit supplies to the light emitting element, a voltage detector that obtains an output of a voltage Vf between the anode and cathode of the light emitting element during a period of instantaneous interruption as a measuring object, and a determiner that determines the existence of the short-circuit from the output.

Appendix 2

The light emitting element failure detector according to Appendix 1, comprising a DC power supply that generates a predetermined direct-current voltage and is connected to one of input terminals of the voltage detector, wherein the direct-current voltage has a polarity such that an electric potential difference between the input terminals is equal to a voltage obtained by subtracting an absolute value of the direct-current voltage from the voltage Vf, the output is an output in cases where the electric potential difference between the input terminals is equal to a voltage obtained by subtracting the absolute value of the direct-current voltage from the voltage Vf, and the determiner determines the existence of the short-circuit by the sign of the output.

Appendix 3

The light emitting element failure detector according to Appendix 1 or 2, wherein the current instantaneous interruption circuit comprises a switcher that switches between supplying and stopping an electric current from the constant current circuit to the light emitting element, and a switch controller that controls switching of the switcher.

Appendix 4

The light emitting element failure detector according to Appendix 3, wherein the light emitting element circuit further comprises a PWM signal generator that sets a pulse width based on a set dimming level and generates a PWM signal comprising a pulse train having a set pulse width, a drive circuit that receives the PWM signal generated in the PWM signal generator and outputs a PWM control signal comprising a pulse train having the same pattern as the pattern of the PWM signal, and a current-controlling switch that is arranged on the current supply path, to which the PWM control signal is input, and switches supplying and stopping of an electric current to the light emitting element by the PWM control signal, the PWM signal generator generates the PWM signal by removing at least one pulse in succession from the pulse train at a predetermined cycle and supplies the generated PWM signal to the drive circuit, the current-controlling switch arranged on the current supply path different from the electric discharge path serves as the switcher, and the PWM signal generator and the drive circuit serve as the switch controller by setting a period of absence of a pulse to the instantaneous interruption period of an electric current.

Appendix 5

The light emitting element failure detector according to Appendix 4, wherein the PWM signal generator selects the number of pulse which is removed in succession based on the set pulse width and the instantaneous interruption period which is set in advance.

Appendix 6

The light emitting element failure detector according to any one of Appendices 1 to 5, wherein the light emitting element is an organic EL element.

Appendix 7

The light emitting element failure detector according to any one of Appendices 1 to 5, wherein the light emitting element is an LED element.

Appendix 8

A light emitting element failure detection method that detects a short-circuit of a light emitting element in a light emitting element circuit that includes the light emitting element, a current supply path to the light emitting element, a constant current circuit that supplies a current to the light emitting element via the current supply path, and an electric discharge path that discharges an electric charge accumulated at the light emitting element and at a region connected between both electrodes of the light emitting element when the constant current circuit stops a current supply to the light emitting element, the light emitting element failure detection method comprising:

a current instantaneous interruption step in which, on the current supply path different from the electric discharge path, an electric current that the constant current circuit supplies to the light emitting element is instantaneously interrupted, a voltage detection step in which an output is obtained by using a voltage Vf between the anode and cathode of the light emitting element during a period of the instantaneous interruption as a measuring object, and a determination step in which the existence of a short-circuit is determined from the output.

The above-mentioned Embodiments are illustrations of specific embodiments of the present invention, and are not intended for limiting the technical scope of the present invention. The present invention can be freely modified, applied, or improved to be carried out within the technical spirit described in CLAIMS.

The present invention is based on Japanese Patent Application No. 2011-148536, filed on Jul. 4, 2011. DESCRIPTION, CLAIMS, and DRAWINGS of Japanese Patent Application No. 2011-148536 are hereby incorporated by reference in their entirety.

INDUSTRIAL APPLICABILITY

The present invention is suitable for a light emitting element failure detector for detecting a light emitting element failure and a light emitting element failure detection method.

REFERENCE SIGNS LIST

1 Light emitting element
2 Constant current circuit
3 AC power supply
4 Light emitting element failure detector
5 Current instantaneous interruption circuit
6 Failure detector
7 Capacitor
8 Diode
9 Coil
10 Resistance
11 PWM dimmer circuit
50 Switcher
51 Switch controller
60 Voltage detector
61 DC power supply
62 Determiner
110 Current-controlling switch
111 Dimming level setter
112 PWM signal generator
113 Drive circuit

The invention claimed is:

1. A light emitting element failure detector that detects a short-circuit of a light emitting element in a light emitting element circuit that includes the light emitting element, a current supply path to the light emitting element, a constant current circuit that supplies a current to the light emitting element via the current supply path, and an electric discharge path that discharges an electric charge accumulated at the light emitting element and at a region connected between both electrodes of the light emitting element when the constant current circuit stops a current supply to the light emitting element, the light emitting element failure detector comprising:
  a current instantaneous interruption circuit that is arranged on the current supply path different from the electric discharge path and that is configured to instantaneously interrupt an electric current that the constant current circuit supplies to the light emitting element,
  a voltage detector that obtains a voltage Vf between an anode and cathode of the light emitting element during a period of instantaneous interruption, and
  a determiner that determines that the light emitting element is short-circuited when the voltage Vf, obtained by the voltage detector during the period of instantaneous interruption, decreases to or lower than a threshold that is lower than a lower limit of a fluctuation of a voltage of a light emitting element at a normal state,
  wherein the period of instantaneous interruption is set to a time which is longer than a time for the voltage Vf to decrease to 0 V if the light emitting element is short-circuited.

2. The light emitting element failure detector according to claim 1, comprising
  a DC power supply that generates a predetermined direct-current voltage and is connected to one of two input terminals of the voltage detector, wherein
  the direct-current voltage has a polarity such that an electric potential difference between the input terminals is equal to a voltage obtained by subtracting an absolute value of the direct-current voltage from the voltage Vf,
  an output of the voltage detector is an output in cases where the electric potential difference between the input terminals is equal to a voltage obtained by subtracting the absolute value of the direct-current voltage from the voltage Vf, and
  the determiner determines the existence of the short-circuit by a sign of the output.

3. The light emitting element failure detector according to claim 1, wherein the current instantaneous interruption circuit comprises
  a switcher that switches between supplying and stopping an electric current from the constant current circuit to the light emitting element, and
  a switch controller that controls switching of the switcher.

4. The light emitting element failure detector according to claim 3, wherein
  the light emitting element circuit further comprises a PWM signal generator that sets a pulse width based on a set dimming level and generates a PWM signal comprising a pulse train having a set pulse width, a drive circuit that receives the PWM signal generated in the PWM signal generator and outputs a PWM control signal comprising a pulse train having the same pattern as the pattern of the PWM signal, and a current-controlling switch that is arranged on the current supply path, to which the PWM control signal is input, and switches supplying and stopping of an electric current to the light emitting element by the PWM control signal,
  the PWM signal generator generates the PWM signal by removing at least one pulse in succession from the pulse train at a predetermined cycle and supplies the generated PWM signal to the drive circuit,
  the current-controlling switch arranged on the current supply path different from the electric discharge path serves as the switcher, and
  the PWM signal generator and the drive circuit serve as the switch controller by setting a period of absence of a pulse to the instantaneous interruption period of an electric current.

5. The light emitting element failure detector according to claim 4, wherein the PWM signal generator selects a number of pulses which are removed in succession based on the set pulse width and the instantaneous interruption period which is set in advance.

6. The light emitting element failure detector according to claim 1, wherein the light emitting element is an organic EL element.

7. The light emitting element failure detector according to claim 1, wherein the light emitting element is an LED element.

8. A light emitting element failure detection method that detects a short-circuit of a light emitting element in a light emitting element circuit that includes the light emitting element, a current supply path to the light emitting element, a constant current circuit that supplies a current to the light emitting element via the current supply path, and an electric discharge path that discharges an electric charge accumulated at the light emitting element and at a region connected between both electrodes of the light emitting element when the constant current circuit stops a current supply to the light emitting element, the light emitting element failure detection method comprising:

a current instantaneous interruption step in which, on the current supply path different from the electric discharge path, an electric current that the constant current circuit supplies to the light emitting element is instantaneously interrupted, a voltage detection step that obtains a voltage Vf between an anode and cathode of the light emitting element during a period of the instantaneous interruption, and a determination step in which the light emitting element is determined to be short-circuited when the voltage Vf, obtained by the voltage detection step during the period of instantaneous interruption, decreases to or lower than a threshold that is lower than a lower limit of a fluctuation of a voltage of a light emitting element at a normal state, wherein the period of instantaneous interruption is set to a time which is longer than a time for the voltage Vf to decreases to 0 V if the light emitting element is short-circuited.

\* \* \* \* \*